US010818823B2

United States Patent
Sato

(10) Patent No.: US 10,818,823 B2
(45) Date of Patent: *Oct. 27, 2020

(54) GROUP III NITRIDE SEMICONDUCTOR LIGHT-EMITTING ELEMENT AND WAFER INCLUDING SUCH ELEMENT CONFIGURATION

(71) Applicant: STANLEY ELECTRIC CO., LTD., Meguro-ku, Tokyo (JP)

(72) Inventor: Tomoaki Sato, Yamaguchi (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/327,852

(22) PCT Filed: Aug. 22, 2017

(86) PCT No.: PCT/JP2017/029954
§ 371 (c)(1),
(2) Date: Feb. 24, 2019

(87) PCT Pub. No.: WO2018/038105
PCT Pub. Date: Mar. 1, 2018

(65) Prior Publication Data
US 2019/0198714 A1    Jun. 27, 2019

(30) Foreign Application Priority Data
Aug. 26, 2016    (JP) .................................. 2016-166323

(51) Int. Cl.
*H01L 33/38*    (2010.01)
*H01L 33/20*    (2010.01)
(Continued)

(52) U.S. Cl.
CPC .............. *H01L 33/38* (2013.01); *H01L 29/41* (2013.01); *H01L 33/20* (2013.01); *H01L 33/32* (2013.01)

(58) Field of Classification Search
CPC ......... H01L 33/20; H01L 33/32; H01L 33/38; H01L 29/41
See application file for complete search history.

(56) References Cited

U.S. PATENT DOCUMENTS 5,696,389 A   12/1997   Ishikawa et al.
8,643,044 B2   2/2014   Tachibana et al.
(Continued)

FOREIGN PATENT DOCUMENTS

JP    H07254732 A    10/1995
JP    2004064080 A    2/2004
(Continued)

OTHER PUBLICATIONS

International Search Report (ISR) dated Oct. 10, 2017 issued in International Application No. PCT/JP2017/029954.
(Continued)

*Primary Examiner* — Christine A Enad
(74) *Attorney, Agent, or Firm* — Holtz, Holtz & Volek PC

(57) ABSTRACT

A group III nitride semiconductor light-emitting element is provided which includes an active layer between an n-type layer and a p-type layer, an n-electrode on the n-type layer, and a p-electrode on the p-type layer, and having a mesa structure including the p-type layer, and is characterized in that: the p-electrode has, in a top view of the group III nitride semiconductor light-emitting element, a protruding portion in a mesa end direction and an n-electrode non-formation region in the vicinity of the mesa end of a projecting end portion of the protruding portion.

3 Claims, 7 Drawing Sheets

(51) Int. Cl.
  *H01L 33/32* (2010.01)
  *H01L 29/41* (2006.01)

(56) References Cited

U.S. PATENT DOCUMENTS

| | | |
|---|---|---|
| 10,312,412 B2 * | 6/2019 | Obata .................. H01L 33/32 |
| 2004/0021143 A1 | 2/2004 | Stockman |
| 2006/0043388 A1 * | 3/2006 | Kwak .................. H01L 33/405 257/80 |
| 2006/0091786 A1 | 5/2006 | Chakraborty et al. |
| 2006/0138445 A1 * | 6/2006 | Zhao .................. H01L 33/20 257/102 |
| 2006/0284191 A1 | 12/2006 | Yang et al. |
| 2006/0284195 A1 | 12/2006 | Nagai |
| 2007/0102715 A1 | 5/2007 | Ko et al. |
| 2007/0170415 A1 | 7/2007 | Maruta |
| 2007/0181888 A1 | 8/2007 | Kim et al. |
| 2009/0242904 A1 | 10/2009 | Ogihara et al. |
| 2012/0061713 A1 | 3/2012 | Tachibana et al. |
| 2012/0187412 A1 | 7/2012 | D'Evelyn et al. |
| 2012/0326117 A1 | 12/2012 | Tanaka et al. |
| 2014/0131731 A1 | 5/2014 | Kim et al. |
| 2014/0209923 A1 | 7/2014 | Xie et al. |
| 2014/0346546 A1 | 11/2014 | D'Evelyn et al. |
| 2015/0048304 A1 * | 2/2015 | Niwa .................. H01L 33/32 257/13 |
| 2015/0098224 A1 | 4/2015 | Hong et al. |

FOREIGN PATENT DOCUMENTS

| | | |
|---|---|---|
| JP | 2005109113 A | 4/2005 |
| JP | 2005197473 A | 7/2005 |
| JP | 2007134700 A | 5/2007 |
| JP | 2007165725 A | 6/2007 |
| JP | 2007214569 A | 8/2007 |
| JP | 2009260246 A | 11/2009 |
| JP | 2012216866 A | 11/2012 |
| JP | 2013030817 A | 2/2013 |
| JP | 2014060255 A | 4/2014 |
| JP | 2014096460 A | 5/2014 |
| JP | 2014096539 A | 5/2014 |
| JP | 2014096592 A | 5/2014 |
| JP | 2015076617 A | 4/2015 |
| WO | 2011033625 A1 | 3/2011 |
| WO | 2016143574 A1 | 9/2016 |

OTHER PUBLICATIONS

Written Opinion dated Oct. 10, 2017 issued in International Application No. PCT/JP2017/029954.
Related U.S. Pat. No. 10,312,412; First Named Inventor: Toshiyuki Obata; Title: "Group III Nitride Semiconductor Light Emitting Element and Wafer Containing Element Structure"; Filed: Sep. 1, 2017.
Kumakura, et al., "Minority carrier diffusion length in GaN: Dislocation density and doping concentration dependence", Applied Physics Letter, vol. 86, No. 5, 2005, pp. 52105-1-52105.3.

* cited by examiner

GROUP III NITRIDE SEMICONDUCTOR LIGHT-EMITTING ELEMENT AND WAFER INCLUDING SUCH ELEMENT CONFIGURATION

TECHNICAL FIELD

The present invention relates to a group III nitride semiconductor light-emitting element having an emission peak wavelength of ultraviolet rays. In particular, the present invention relates to a technique for suppressing current concentration at an end portion of a mesa structure of a light-emitting element. The present invention also relates to a wafer including the light-emitting element configuration.

BACKGROUND ART

FIGS. 1 and 2 show a representative schematic structure of a group III nitride semiconductor light-emitting element 1. FIG. 1 is a top view of the element, and FIG. 2 is a cross-sectional view taken along line A-A of FIG. 1. As the group III nitride semiconductor light-emitting element 1, there has been a known element in which a stacked body including an n-type layer 3, an active layer 4, and a p-type layer 5 (hereinafter, sometimes referred to as a "stacked semiconductor layer") is formed on one surface side of a substrate 2, and a mesa structure 6 is formed in part of the stacked semiconductor layer. The mesa structure 6 is formed by forming the stacked semiconductor layer including the n-type layer 3, the active layer 4, and the p-type layer 5 on one surface side of the substrate 2, and then removing part of the stacked structure by etching or the like to expose part of the n-type layer 3. The mesa structure 6 is formed by leaving a plateau-like portion (also called a mesa) including the active layer 4 and the p-type layer 5 (see Patent Literature 1). An n-electrode 7 is formed on the exposed surface of the n-type layer 3, and a p-electrode 8 is formed on the surface of the p-type layer 5.

In the group III nitride semiconductor light-emitting element 1 having the mesa structure 6, when an operating voltage is applied to the p-electrode 8 on the p-type layer 5 and the n-electrode 7 on the n-type layer 3, current tends to flow in a path with a low resistance (usually, a shortest path) between the p-electrode 8 and the n-electrode 7, so that the current flows in a concentrated manner in a region near the end portion of the mesa structure 6 adjacent to the n-electrode 7 and the p-electrode 8 (hereinafter, sometimes referred to as a "mesa end"). As a result, the current does not uniformly flow through the active layer 4, so that light emission unevenness occurs. In addition, since the current concentrates in the mesa end, heat is locally generated in the vicinity of the mesa end. As a result, deterioration of the light-emitting element easily progresses, which leads to a decrease in light-emitting efficiency, an increase in operating voltage, a decrease in reliability, and the like.

Patent Literature 2 discloses an ultraviolet semiconductor light-emitting element in which a high resistance layer having a higher resistance than a p-type layer or a p-electrode is formed in a shape along a shape of the p-type layer on the surface of the p-type layer on a side closer to the n-electrode. When the high resistance layer is formed on the p-type layer near the mesa end as in Patent Literature 2, the concentration of current in the region near the mesa end can be suppressed. However, due to the presence of the high resistance layer, the resistance between the p-electrode and the semiconductor layer increases, resulting in a problem that the operating voltage increases.

Patent Literature 3 discloses a semiconductor light-emitting element in which a trench is formed between a p-electrode and an n-electrode. The formation of the trench reduces variation in the length of the current path flowing between the p-electrode and the n-electrode, and suppresses the concentration of current in a specific portion. However, it is necessary to increase the depth of the trench in order to sufficiently reduce the variation in the length of the current path. Increasing the depth of the trench causes a problem that the entire current path becomes longer, so that the resistance becomes larger and the operating voltage increases.

Further, light-emitting elements of various shapes and configurations have been proposed due to the diversification of device designs in recent years, and the designs of mesa structures and electrode shapes have also been diversified. Techniques such as the formation of the high resistance layer and the formation of the trench cause an increase in the number of steps in the manufacture of the light-emitting element, and therefore, it is difficult to quickly respond to diversified mesa structures and electrode shapes.

Particularly, in a deep ultraviolet light-emitting element having an emission peak wavelength of 200 to 350 nm, it is difficult to manufacture the light-emitting element itself, and the yield is likely to be lowered. Further, since the current concentrates in the region near the mesa end when the current is supplied, the deterioration of the portion progresses due to heat generation or the like, and a quality defect is likely to occur. Therefore, it has been desired to develop a light-emitting element capable of suppressing deterioration due to the concentration of current in a region near the mesa end.

CITATION LIST

Patent Literature

Patent Literature 1: Japanese Patent Application Laid-Open No. 2014-096539
Patent Literature 2: Japanese Patent Application Laid-Open No. 2014-096460
Patent Literature 3: Japanese Patent Application Laid-Open No. 2007-134700

SUMMARY OF INVENTION

Technical Problem

An object of the present invention is to provide a technique for suppressing deterioration of a light-emitting element due to the concentration of current flowing between a p-electrode and an n-electrode in a region near a mesa end without increasing the number of steps in manufacturing the light-emitting element.

Solution to Problem

The present inventors have intensively investigated the above-mentioned problems. First, when the portion where the current flowing between the p-electrode and the n-electrode concentrates was examined, they found that the current flowing between the p-electrode and the n-electrode particularly concentrates in the vicinity of the mesa ends (8 in FIG. 1) of the mesa structure in which at least three sides of the p-type layer are surrounded by the n-type layer when the group III nitride semiconductor light-emitting element is viewed from above. Therefore, they considered that the above-mentioned problem could be solved by adjusting the structure of the n-electrode around the mesa structure described above, and intensively carried out the study. As a result, they have found that the concentration of current in that portion can be suppressed by providing no n-electrode at at least one end of the mesa ends of the mesa structure in which the three sides are surrounded by the n-type layer, or by arranging an n-electrode at a predetermined distance, whereby the present invention has been completed.

That is, the first invention is a group III nitride semiconductor light-emitting element including an active layer between an n-type layer and a p-type layer, an n-electrode on the n-type layer, and a p-electrode on the p-type layer, and having a mesa structure including the p-type layer, and characterized in that: the n-type electrode and the p-type electrode are present in the same top view of the group III nitride semiconductor light-emitting element; the mesa structure in the top view is configured such that at least three sides of the p-type layer are surrounded by the n-type layer; and the n-electrode does not substantially exist at at least one end of mesa ends in the mesa structure or is disposed 50 μm or more away from at least one end of the mesa ends.

In the group III nitride semiconductor light-emitting element of the present invention described above, it is preferable to adopt the following aspects.

1) The n-electrode does not substantially exist at a shortest mesa end in the mesa structure in which the at least three sides are surrounded by the n-type layer in the top view, or is disposed 50 μm or more away from at least one end of the mesa ends.

2) The n-electrodes are electrically connected to each other through a region in which the n-electrodes do not exist in the top view.

3) The emission peak wavelength of the group III nitride semiconductor light-emitting element is 200 to 350 nm.

Advantageous Effects of the Invention

The present invention is characterized in that, when the group III nitride semiconductor light-emitting element is viewed from above, a region in which an n-electrode does not exist (hereinafter, also referred to as an "n-electrode non-formation region") is provided in the vicinity of the mesa end of the projecting end portion of a protruding portion of the p-type layer. When a voltage is applied to the group III nitride semiconductor light-emitting element, electrons flow from the n-type electrode toward the p-type electrode. At this time, in the mesa structure portion in which at least three sides of the p-type layer are surrounded by the n-type layer, if the n-type electrode is provided at all of the mesa ends of the mesa structure, electrons flow into the mesa structure portion from each side, and more electrons flow than in the other p-electrode portions. Since the light emission is stronger and deterioration of the p-type electrode and the light-emitting layer becomes remarkable as the number of electrons flowing there increases, the group III nitride semiconductor light-emitting element having the above-mentioned electrode structure tends to cause light emission unevenness, deterioration of the p-type electrode, and deterioration of the light-emitting layer.

Therefore, in the present invention, by providing the n-electrode non-formation region at at least one end of the mesa ends in the mesa structure portion in which the at least three sides of the p-type layer are surrounded by the n-type layer, it is possible to suppress the concentration of current to the p-type electrode and the light-emitting layer provided on the p-type layer. As a result, a group III nitride semiconductor light-emitting element is obtained in which local deterioration in the mesa structure is less likely to occur, and light emission unevenness is less likely to occur due to the matter in which current easily flows uniformly into the active layer.

As a result, it is possible to reduce the occurrence of quality defects due to current concentration in the vicinity of the mesa end when current is supplied, so that the yield of the light-emitting element can be improved.

As a method of suppressing the current concentration on the p-type electrode provided on the p-type layer, a method of providing no p-type electrode in the vicinity of the end portion of the mesa structure may be considered. In this case, the p-type electrode is provided at the center portion of the p-type layer, so that the light-emitting area tends to decrease. In the present invention, since the n-electrode non-formation region is provided on the n-type layer side of the end portion of the mesa structure, it is possible to provide the p-type electrode up to the vicinity of the p-type layer side of the end portion of the mesa structure, and thus, a wide light-emitting area can be obtained.

Note that the conventional technique does not provide an n-electrode non-formation region in the direction of the protruding portion of the mesa end described above. The inventors of the present invention have found that, when the non-formation region of the n-electrode is provided only in the direction of the protruding portion of the mesa end, current concentration can be effectively suppressed without excessively increasing the operating voltage, and the yield of the light-emitting element can be improved, and thus the present invention has been completed.

In particular, an ultraviolet light-emitting element having an emission peak wavelength of 200 to 350 nm is more difficult to manufacture due to the influence of the composition of each layer than a light-emitting element having an emission peak wavelength of more than 350 nm, for example, a light-emitting element in the visible light region, and the yield tends to be lowered. As described above, the present invention is suitable for an ultraviolet light-emitting element having an emission peak wavelength of 200 to 350 nm because the present invention can suppress a decrease in yield caused by local deterioration in the mesa structure.

DESCRIPTION OF EMBODIMENTS

Embodiments of the present invention will be described below with reference to the drawings as appropriate. However, the light-emitting element described below is an example by which the technical idea of the present invention is embodied, and does not limit the present invention. For example, the dimensions, materials, shapes, relative arrangements and the like of the components described below are not intended to limit the scope of the present invention only thereto, and are merely illustrative examples, unless specifically stated otherwise. Note that the sizes, positional relationships, and the like of the members illustrated in the respective drawings may be exaggerated for clarity of description.

The light-emitting region of the light emitted by the group III nitride semiconductor light-emitting element of the present invention is not particularly limited. According to the present invention, regardless of the light-emitting region, it is possible to suppress a decrease in output caused by deterioration due to local current concentration in the mesa structure, and to improve the yield. Preferably, the present invention is applied to a group III nitride semiconductor light-emitting element having an emission peak wavelength in a visible light region or an ultraviolet region. More preferably, the present invention is applied to a group III nitride semiconductor light-emitting element that emits ultraviolet rays having an emission peak wavelength of 200 to 350 nm. Hereinafter, the group III nitride semiconductor light-emitting element having an emission peak wavelength of 200 to 350 nm will be mainly described.

Figure 1:
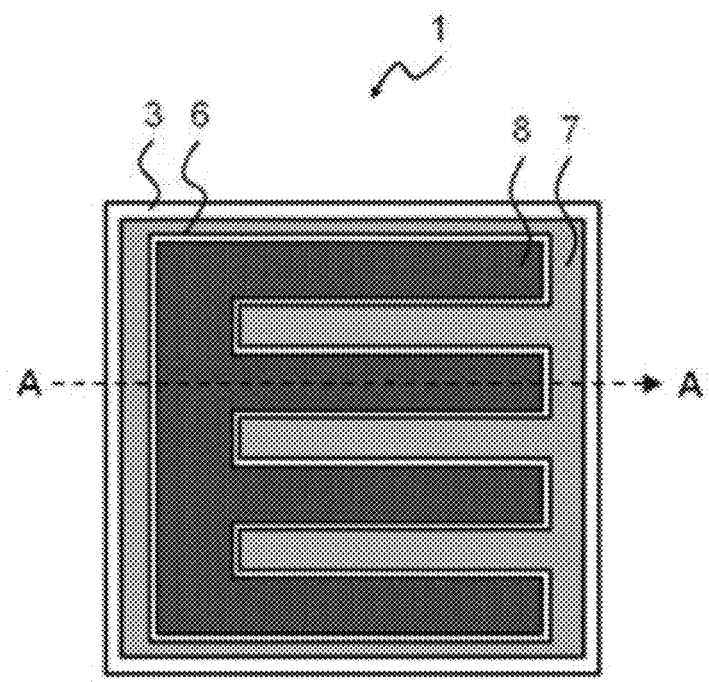
FIG. 1 shows an example of a representative group III nitride semiconductor light-emitting element when viewed from above.
Figure 2:
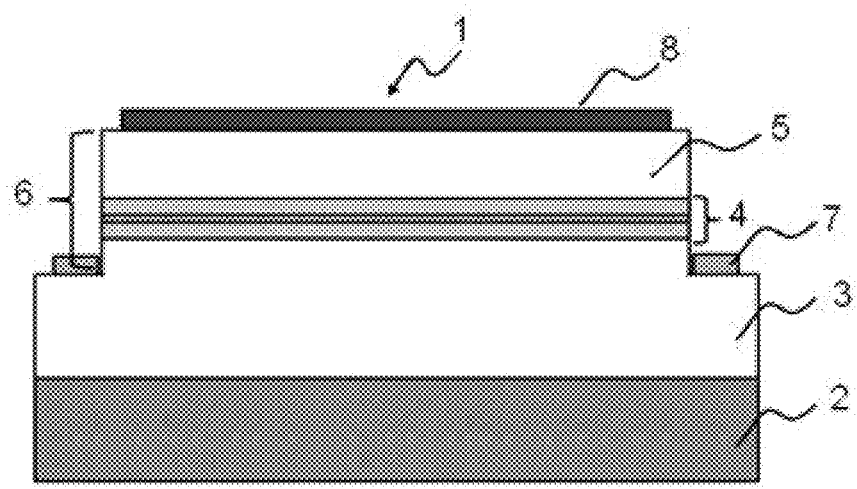
FIG. 2 is a cross-sectional view of the representative group III nitride semiconductor light-emitting element.

As shown in FIGS. 1 and 2, a representative group III nitride semiconductor light-emitting element 1 includes a substrate 2, a mesa structure 6 (stacked semiconductor layer) including an n-type layer 3, an active layer 4, and a p-type layer 5, and an n-electrode 7 and a p-electrode 8. Non-limiting representative examples concerning these components will be described below.

The refractive index, transmittance, and reflectance were based on light having a wavelength of 265 nm. This is because it is considered that light having a wavelength of 265 nm is most suitable for sterilization because DNA has a maximum absorption in the vicinity of a wavelength of 265 nm, and is highly useful in industry. Hereinafter, when the refractive index, transmittance, and reflectance are simply refereed to, they are values for light having a wavelength of 265 nm.

<Substrate>

The substrate 2 is not particularly limited as long as the substrate 2 has a surface that can be used for epitaxial growth of a group III nitride semiconductor crystal, and transmits ultraviolet rays. Examples of the material used for the substrate 2 may include sapphire, SiC (silicon carbide), and AlN (aluminum nitride). Among these, an AlN single crystal substrate having a C-plane as its principal surface is preferable.

The higher the transmittance of the substrate 2 with respect to light having a wavelength of 265 nm, the better. The transmittance of the substrate 2 is preferably 50% or more, more preferably 60% or more. The upper limit of the transmittance of the substrate 2 is preferably 100%, but it is 80% in consideration of industrial production. The transmittance of the translucent substrate can be adjusted by the material, the thickness of the substrate, the crystallinity, and the impurity content.

The thickness of the substrate 2 is not particularly limited, but is preferably 30 to 150 μm, more preferably 50 to 100 μm. By setting the thickness of the substrate 2 within the aforementioned range, the transmittance and productivity are improved. It is sufficient if the thickness of the substrate 2 satisfies the aforementioned range after manufacturing the group III nitride semiconductor light-emitting element. The thickness of the substrate may be made to fall within the aforementioned range by grinding or polishing the lower surface of the substrate after stacking a stacked semiconductor layer or an electrode, which will be described later, on the substrate.

<Stacked Semiconductor Layer>

The stacked semiconductor layer (main part of the element including the mesa structure 6 in FIG. 1) is formed on the substrate 2 as shown in FIG. 2. The stacked semiconductor layer is formed by stacking the n-type layer 3, the active layer 4, and the p-type layer 5 (a layer composed of a p-type cladding layer and a p-type contact layer) in this order. Non-limiting examples concerning the respective layers will be described below.

<N-Type Layer>

The n-type layer 3 is a group III nitride semiconductor composed of $Al_xIn_yGa_zN$ (x, y, and z are rational numbers satisfying $0<x\leq1.0$, $0\leq y\leq0.1$, and $0\leq z<1.0$, and $x+y+z=1.0$), and preferably contains an impurity.

The impurity is not particularly limited, and examples thereof may include Si, Ge, and Sn. Among these, Si is preferable. The concentration of the impurity is $1.0\times10^{17}$ cm$^{-3}$ or more and $5.0\times10^{20}$ cm$^{-3}$ or less, preferably $1.0\times10^{19}$ cm$^{-3}$ or more and $5.0\times10^{19}$ cm$^{-3}$ or less. By setting the concentration of the impurity in the aforementioned range, the crystallinity and contact characteristics of the n-type layer are improved. Such an n-type layer can be produced by the MOCVD method.

The refractive index of the n-type layer is not particularly limited, but is 1.5 to 3.0. It is sufficient if the refractive index is adjusted by the composition of the n-type layer or the like.

The thickness of the n-type layer is 100 nm or more and 10,000 nm or less, preferably 500 nm or more and 3,000 nm or less. By setting the thickness of the n-type layer in the aforementioned range, the crystallinity and conductivity of the n-type layer are improved.

Although not shown in FIG. 1, the group III nitride semiconductor light-emitting element 1 may have a buffer layer that is disposed between the substrate 2 and the n-type layer 3 and contains AlN or a group III nitride semiconductor having the same or similar composition as or to that of the above-mentioned n-type layer.

As will be described later, in a general group III nitride semiconductor light-emitting element, electrons flow from the n-electrode to the p-electrode through the n-type layer. The diffusion length of electrons at this time is affected by the composition and specific resistance of the n-type layer. Therefore, it is preferable that the diffusion length of electrons is not too long from the viewpoint of suppressing the current concentration in the protruding portion of the mesa end, which will be described later. It is preferable that the Al composition x of the n-type layer falls within the range of 0.6 to 0.8, and the specific resistance falls within the range of 0.01 to 0.03 Ω·cm.

<Active Layer>

The active layer 4 is formed from a stacked layer structure composed of a well layer composed of $Al_xIn_yGa_zN$ (x, y, and z are rational numbers satisfying $0<x\leq1.0$, $0\leq y\leq0.1$, and $0\leq z<1.0$, and $x+y+z=1.0$) and a barrier layer composed of $Al_xIn_yGa_zN$ (x, y, and z are rational numbers satisfying $0<x\leq1.0$, $0\leq y\leq0.1$, and $0\leq z<1.0$, and $x+y+z=1.0$) having a band gap energy larger than that of the well layer. The active layer may be formed from a multiple quantum well structure or a single quantum well structure.

The thickness of the well layer is 1 nm or more, preferably 2 nm or more, and the upper limit is 10 nm. The thickness of the barrier layer is 1 nm or more, preferably 2 nm or more, and the upper limit is 1 μm. Such an active layer can be produced by the MOCVD method.

<P-Type Layer>

The p-type layer 5 is composed of a p-type cladding layer and a p-type contact layer. The p-type cladding layer is a group III nitride semiconductor composed of $Al_xIn_yGa_zN$ (x, y, and z are rational numbers satisfying $0<x\leq1.0$, $0\leq y\leq0.1$, and $0\leq z<1.0$, and $x+y+z=1.0$) and preferably contains an impurity.

The impurity of the p-type cladding layer is preferably Mg. The concentration of the impurity in the p-type cladding layer is $1.0\times10^{17}$ cm$^{-3}$ or more and $5.0\times10^{20}$ cm$^{-3}$ or less, preferably $1.0\times10^{18}$ cm$^{-3}$ or more and $5.0\times10^{20}$ cm$^{-3}$ or less. The thickness of the p-type cladding layer is 5 nm or more and 100 nm or less, preferably 10 nm or more and 70 nm or less.

The p-type contact layer is a group III nitride semiconductor composed of $Al_xIn_yGa_zN$ (x, y, and z are rational numbers satisfying $0\leq x<1.0$, $0\leq y\leq0.1$, and $0<z\leq1.0$, and $x+y+z=1.0$). Preferably, the p-type contact layer is composed of GaN. If the p-type contact layer is composed of GaN, that is, if the p-type contact layer is a p-GaN layer, the contact characteristics of the p-type contact layer can be improved. The p-type contact layer preferably contains an impurity.

The impurity of the p-type contact layer is preferably Mg similarly to the p-type cladding layer. The concentration of the impurity in the p-type contact layer is $1.0\times10^{17}$ cm$^{-3}$ or more and $5.0\times10^{20}$ cm$^{-3}$ or less, preferably $1.0\times10^{18}$ cm$^{-3}$ or more and $2.0\times10^{20}$ cm$^{-3}$ or less. The thickness of the p-type contact layer is 1 nm or more and 400 nm or less, preferably 250 nm or more and 350 nm or less. By setting the thickness of the p-type contact layer in the aforementioned range, the ultraviolet transmittance and the contact characteristics of the p-type layer are improved.

<N-Electrode>

The n-electrode 7 is formed on the exposed surface of the n-type layer 3. The exposed surface of the n-type layer 3 is formed by means of etching or the like. By forming the exposed surface of the n-type layer 3, the stacked semiconductor layer remains in a plateau shape, so that the mesa structure 6 is formed. The n-electrode 7 on the n-type layer 3 is formed along the lower end of the mesa structure 6 in the low-lying portion of the mesa structure 6, but may have a structure in which the n-type layer 3 is exposed between the mesa structure 6 and the n-electrode 7 at a distance from the bottom of the mesa structure 6. In the present invention, the formation region of the n-electrode 7 is set on the basis of predetermined guidelines related to the shape of the mesa structure 6. As a result, current that is likely to concentrate in the vicinity of the mesa end is diffused, and current concentration to the mesa end is suppressed. The guidelines for setting the formation pattern of the n-electrode will be described later, and first, non-limiting representative examples concerning the nature of a general n-electrode and the formation method thereof will be described.

Examples of the etching technique for forming the mesa structure 6 may include dry etching such as reactive ion etching and inductively coupled plasma etching. After forming the exposed surface of the n-type layer 3, the exposed surface is preferably subjected to a surface treatment with an acid or alkali solution in order to remove damage caused by etching. After that, the n-electrode 7 having ohmic properties is formed on the exposed surface of the n-type layer 3.

Patterning of the n-electrode 7 can be performed using a lift-off method. In the lift-off method, a photoresist is applied to a surface on which an electrode is to be formed, and ultraviolet rays are irradiated by a UV exposure machine provided with a photomask. Then, the photoresist exposed is dissolved by immersion in a developer to form a desired pattern. After that, electrode metal is deposited on the patterned photoresist, and the photoresist is dissolved by a stripping solution to form a pattern of the electrode metal. As another patterning method, there is a method in which an electrode metal film is formed on an electrode forming surface, a photoresist is applied, the photoresist is patterned through exposure and development processes, the electrode metal is patterned by dry etching or wet etching using the photoresist as a mask, and the photoresist is dissolved by a stripping solution. The lift-off method is preferable because the process is relatively simple.

Examples of the method of depositing the n-electrode metal may include vacuum deposition, sputtering, and chemical vapor deposition. In particular, vacuum deposition is preferable because impurities in the electrode metal can be eliminated. The material used for the n-electrode can be selected from known materials. Examples thereof may include Ti, Al, Rh, Cr, In, Ni, Pt, and Au. Among these, Ti, Al, Rh, Cr, Ni, and Au are preferable. In particular, a combination of Ti, Al, and Au is preferable because ohmic properties and reflectance can be improved. The n-electrode may be a single layer or a multilayer structure containing an alloy or oxide of these metals.

The layer thickness of the n-electrode is not particularly limited, but is preferably 2 nm or more in view of the stability of production, and the upper limit is 2 μm.

The width of the n-electrode is not particularly limited, but is usually about 5 to 100 μm, preferably 10 to 50 jm. In this case, the width of the n-electrode may not be uniform. For example, a narrow portion and a wide portion may be mixed. In this case, it is sufficient if the average width of the n-electrode falls within the aforementioned range.

In order to improve the contact properties thereof with respect to the n-type layer, heat treatment is preferably performed thereon at a temperature of 300° C. to 1,100° C. for 30 seconds to 3 minutes after the deposition of the n-electrode metal. As for the temperature and time of the heat treatment, optimum conditions can be appropriately selected in accordance with the metal type and layer thickness of the n-electrode.

<Formation Pattern of N-Electrode>

The present invention is characterized in that the n-electrode does not substantially exist at at least one end of the mesa ends in the mesa structure in which the at least three sides of the p-type layer are surrounded by the n-type layer or is disposed 50 μm or more away from at least one end of the mesa ends when the group III nitride semiconductor light-emitting element is viewed from above. By providing such an n-electrode non-formation region in the vicinity of the mesa end described above, it is possible to suppress the concentration of current to the p-type electrode provided on the p-type layer.

As shown in FIG. 1, when the n-electrode 7 is formed to surround the plateau-shaped mesa structure 6, conduction between the n-electrode 7 and the p-electrode 8 is preferentially given to a path having a low resistance. Thus, the current is likely to concentrate in a region near the end of the mesa structure 6 (the projecting end portion of the p-electrode 8 protruding in the right direction in FIG. 1, hereinafter referred to as the "protruding portion of the mesa end") in which at least three sides of the p-type layer 5 are surrounded by the n-type layer 3, which is at the shortest distance between the n-electrode 7 and the p-electrode 8.

Accordingly, in the present invention, an n-electrode non-formation region is provided at at least one end of the mesa ends in order to avoid current concentration at the mesa end as described above. When the non-formation region of the n-electrode is provided in this manner, the current is less likely to flow in this portion, so that the current concentration in the region near the end portion of the mesa structure 6 can be suppressed. However, if a non-formation region of the n-electrode is provided at all mesa ends, the area of the n-electrode is reduced accordingly, and therefore the operating voltage of the group III nitride semiconductor light-emitting element may be increased in some cases. Thus, in the present invention, it is sufficient if the non-formation region of the n-electrode is provided particularly in the portion where the current is likely to concentrate.

The outline of the mesa structure 6 varies depending on the electrode pattern in the element design. Therefore, it is difficult to uniquely define the "protruding portion of the mesa end". In view of this, FIG. 2 shows non-limiting examples of the outline of the mesa structure 6 in the top view of the element and the formation pattern of the n-electrode 7, and indicates, by a broken line circle, the "protruding portion of the mesa end" where the current is likely to concentrate. Although the n-electrode 7 and the mesa structure 6 are in contact with each other in the top view of FIG. 2, a tapered portion of the mesa structure or the exposed n-type layer 3 may exist between the end portion of the mesa structure 6 and the n-electrode 7 in the cross section as shown in FIG. 2.

Figure 3:
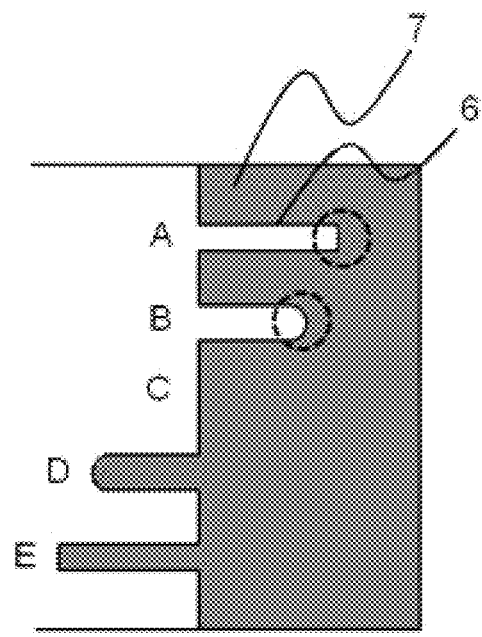
FIG. 3 shows various shape examples of mesa ends.

"A" in FIG. 3 shows a rectangular mesa structure 6. In this structure, since the rectangular projecting end portion protrudes into the formation region of the n-electrode 7, the current is likely to concentrate in this portion. In addition to the rectangular mesa structure 6 described above, the corner portion of the projecting end portion "B" in FIG. 3 may have a circular arc shape, and also in this case, the current is likely to concentrate in the portion encircled with a broken line.

On the other hand, the mesa structures "C" to "E" in FIG. 3 are examples that do not correspond to "a mesa structure in which at least three sides of the p-type layer are surrounded by the n-type layer" in the present application. That is, in "C" in FIG. 3, since the mesa end does not protrude into the formation region of the n-electrode 7, the current is less likely to concentrate in this portion. In addition, "D" and "E" in FIG. 3 include the mesa end that is a recessed portion and does not protrude into the formation region of the n-electrode 7. Thus, the current is less likely to concentrate in this portion.

Figure 4:
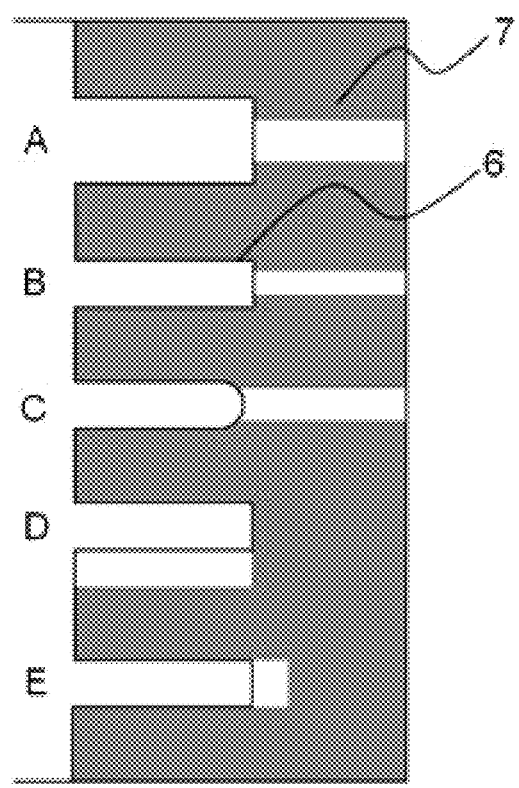
FIG. 4 shows examples in which the n-electrode in top view does not substantially exist at at least one end of the mesa ends in the mesa structure or is disposed 50 μm or more away from at least one end of the mesa ends.

The present invention is characterized in that the n-electrode non-formation region is provided at at least one end of the protruding portion of the mesa end as described above. FIG. 4 shows examples in which the n-electrode non-formation region is provided at at least one end of the protruding portion of the mesa end in the example "A" in FIG. 3.

"A" in FIG. 4 shows an example in which the n-electrode non-formation region is provided from the mesa edge portion, which is the shortest mesa of the protruding portion of the rectangular mesa structure 6, to the end portion of the substrate. Note that, as in the example of "B" above, since the n-electrode does not exist at the shortest mesa end portion in the protruding portion of the mesa end, it is possible to suppress the concentration of current at the mesa end portion.

In the aforementioned mesa structure, when the n-electrode is formed, the n-electrode may be formed in a part on both sides of the shortest mesa edge. Even in such a case, it is sufficient if the n-electrode non-formation region is provided at a portion with at least 50% or more of the circumferential length of the shortest mesa end.

"C" in FIG. 4 is an example in which the n-electrode non-formation region is formed when the corner portion of the projecting end portion of the mesa structure of the structure "A" has an arc shape.

The examples of "A" to "C" described above are examples which have the n-electrode non-formation (cut out) region from the mesa edge to the end of the substrate, but as in the examples of "D" and "E", the n-electrode non-formation region may be formed so that the distance between the mesa end and the n-electrode is at least 50 m or more. In a general group III nitride semiconductor light-emitting element, electrons flow from the n-electrode to the p-electrode through the n-type layer. At this time, the diffusion length of electrons is affected by the composition and specific resistance of the n-type layer disposed below the n-electrode. However, when the diffusion length is less than 50 μm, the concentration of current on the mesa end portion can be suppressed also in the configurations of "D" and "E".

Note that as the diffusion length of electrons is shorter, the current concentration on the end portion of the p-type layer is more likely to occur, and the driving voltage of the light-emitting element also tends to increase. Therefore, the diffusion length is preferably 10 μm or more, more preferably 20 μm or more.

When the n-electrode is formed while being separated away from the mesa end as in the examples of "D" and "E", the voltage tends to increase as the distance increases. Accordingly, the distance is preferably 150 μm or less, more preferably 100 μm or less.

Although the above-described examples are examples in which the n-electrode non-formation region is provided at the shortest mesa edge portion in the protruding portion of the mesa edge, the n-electrode non-formation region may be provided at one edge of the long side of the protruding portion of the mesa. "D" in FIG. 4 shows an example in which the n-electrode non-formation region is provided at one edge of the long side of the protruding portion of the mesa.

Among the examples of the n-electrode non-formation region described above, it is preferable that the n-electrode does not substantially exist at the shortest mesa end in the mesa structure in which at least three sides are surrounded by the n-type layer or is disposed 50 μm or more away from at least one end of the mesa ends when it is viewed from above from the viewpoints of easy formation of the electrode pattern and high effect of suppressing the current concentration onto the protruding portion of the mesa end.

The examples of "A" to "C" of FIG. 4 show the case where the n-electrode is cut out, and thus, a plurality of the n-electrodes exist independently. When a voltage is applied to such n-electrodes, a part of the n-electrodes is energized while no current flows to the other part. Thus, it is preferable that the n-electrodes are electrically connected to each other through a region in which the n-electrode does not exist in the top view from the viewpoint of flowing current to all the n-electrodes. Examples of the method of electrically connecting the n-electrodes may include a method of connecting the n-electrodes with a wire such as a technique of wire bonding, and a pad electrode layer through the n-electrode, which will be described later.

<P-Electrode>

The patterning of the p-electrode 8 is preferably performed using a lift-off method as in the case of the patterning of the n-electrode. The metal material used for the p-electrode can be selected from known materials. Examples thereof may include Ni, Cr, Au, Mg, Zn, Pd, and Pt. Among these, a combination of Ni and Au is preferable. The p-electrode may be a single layer or a multilayer structure containing an alloy or oxide of these metals.

Examples of the method of depositing the p-electrode metal may include vacuum deposition, sputtering, and chemical vapor deposition as in the method of forming the n-electrode. In particular, vacuum deposition is preferable because impurities in the electrode metal can be eliminated. In order to improve the contact properties thereof with respect to the p-type contact layer, heat treatment is preferably performed thereon at a temperature of 200° C. to 800° C. for 30 seconds to 3 minutes after the deposition of the p-electrode metal. As for the temperature and time of the heat treatment, optimum conditions can be appropriately selected in accordance with the metal type and layer thickness of the p-electrode.

The shape of the p-electrode is not limited, but is usually formed in a similar shape slightly smaller than the mesa structure 6 as described above. However, in the mesa end protruding portion in which current concentration is likely to occur, it is preferable to form the mesa end and the p-electrode end separated away from each other in order to suppress current concentration. The width of the p-electrode is not particularly limited as well, and a narrow portion and a wide portion may be mixed.

<Pad Electrode Layer>

When the electrode non-formation region is provided, the n-electrodes may be separated from each other. Usually, after the light-emitting element is formed, the electric characteristics and the optical characteristics of the light-emitting element are evaluated by bringing a probe into contact with the respective p-electrode and n-electrode and energizing the p-electrode and n-electrode. However, if the n-electrode is separated by providing the n-electrode non-formation region, current does not flow to the n-electrode with which the probe is not in contact, so that the n-electrode does not function as an electrode. Therefore, it is preferable to form a pad electrode layer so as to connect the separated n-electrodes. Specifically, in addition to the formation on the n-electrode, the pad electrode layer is also formed on the n-electrode non-formation region where the n-type layer is exposed. As a result, since the n-electrode is connected by means of the pad electrode layer used as a conductive layer, the n-electrode which is not in contact with the probe described above can also function as an electrode.

Usually, the above-described pad electrode layer is not formed on the n-type layer. When the light-emitting element is assembled, the electrode pattern of the light-emitting element and the metal pattern on the surface of the submount are bonded by an Au—Sn solder or an Au bump. However, Au must be present on the outermost surface of the electrode of the light-emitting element in order for the patterns to be bonded to Au—Sn or Au. However, the electrode is alloyed by heat treatment, and Au is scarcely present in the uppermost layer. Thus, it cannot be bonded to the submount as it is. Therefore, a pad electrode layer having Au is usually formed in the uppermost layer. However, this is formed only on the electrode and not on the n-type layer.

As described above, the pad electrode layer 9 is formed on the p-electrode 8, the n-electrode 7, and the n-electrode non-formation region. The patterning of the pad electrode layer is preferably performed by using a lift-off method as in the patterning of the p- and n-electrodes. The metal material used for the pad electrode layer can be selected from known materials. Examples thereof may include Ti, Ni, Cr, Au, Mg, Zn, Pd, and Pt. Among these, a combination of Ti, Ni, and Au is preferable. Examples of the method of depositing the pad electrode layer metal may include vacuum deposition, sputtering, and chemical vapor deposition as in the method of forming the p- and n-electrodes. In particular, vacuum deposition is preferable because impurities in the electrode metal can be eliminated. Since the pad electrode layer does not function as an electrode, heat treatment is not performed unlike the p- and n-electrodes. The width of the pad electrode layer is not particularly limited, and a narrow portion and a wide portion may be mixed.

<Manufacture of Light-Emitting Element>

After the wafer including the configuration of the group III nitride semiconductor light-emitting element described above is manufactured, the lower surface of the translucent substrate is ground or polished, so that the thickness of the translucent substrate can be reduced to improve the transmittance. After that, a light-emitting element is manufactured by using a known light-emitting element separation method such as scribing, dicing, laser cutting, or the like as appropriate.

EXAMPLES

The present invention will now be described in more detail by way of examples, which are not intended to limit the present invention in any way.

Examples and Comparative Examples

A stacked semiconductor layer having the cross-sectional structure shown in FIGS. 4 to 8 was formed. First, an $Al_{0.7}Ga_{0.3}N$ layer (1 μm) doped with $1.0\times10^{19}$ cm$^{-3}$ of Si was formed as an n-type semiconductor layer on a C-plane AlN substrate (7 mm square on one side and 500 μm thick) by the MOCVD method. An active layer having a quantum well structure (well layer 2 nm, barrier layer 7 nm) was formed on the n-type layer. At this time, the compositions of the well layer and the barrier layer were $Al_{0.5}Ga_{0.5}N$ and $Al_{0.7}Ga_{0.3}N$, respectively, and the barrier layer was doped with $1.0\times10^{18}$ cm$^{-3}$ of Si. The active layer is formed of a stacked structure of three well layers and four barrier layers.

Next, an AlN layer (15 nm) doped with $5\times10^{19}$ cm$^{-3}$ of Mg was formed on the active layer as an electron-blocking layer. After that, an $Al_{0.8}Ga_{0.2}N$ layer (50 nm) doped with $5\times10^{19}$ cm$^{-3}$ of Mg was formed as a p-cladding layer on the electron-blocking layer. Finally, a GaN layer (300 nm) doped with $2\times10^{19}$ cm$^{-3}$ of Mg was formed on the p-cladding layer as a p-contact layer.

Figure 5:
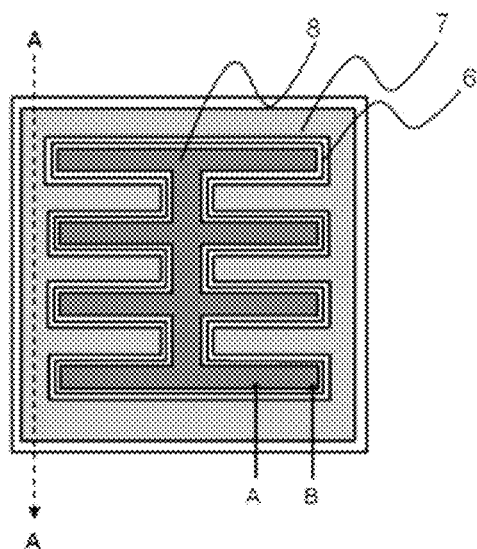
FIG. 5 shows an upper surface structure of a light-emitting element in Comparative Example 1 (without a pad electrode layer).
Figure 6:
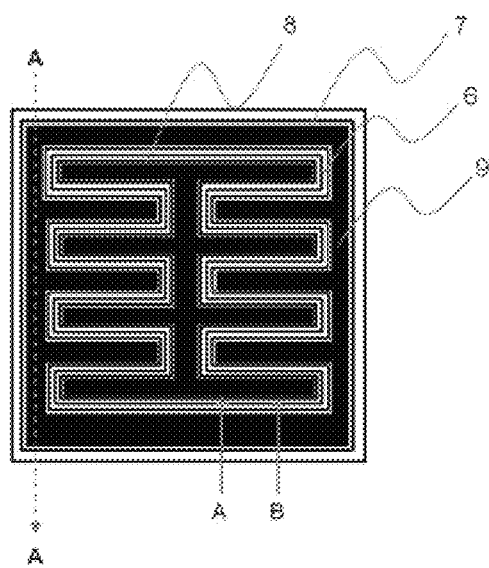
FIG. 6 shows an upper surface structure of a light-emitting element in Comparative Example 1 (with a pad electrode layer).
Figure 7:
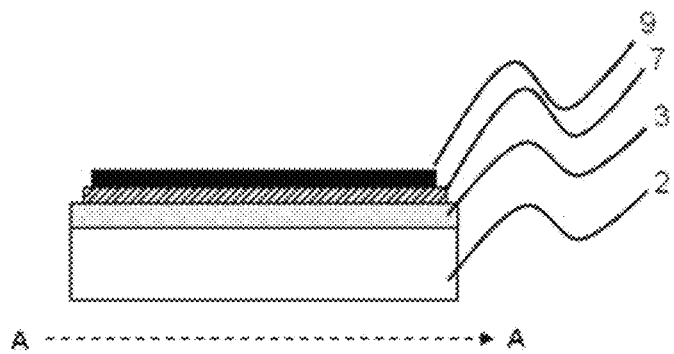
FIG. 7 shows a cross-sectional structure of the light-emitting element in Comparative Example 1.
Figure 8:
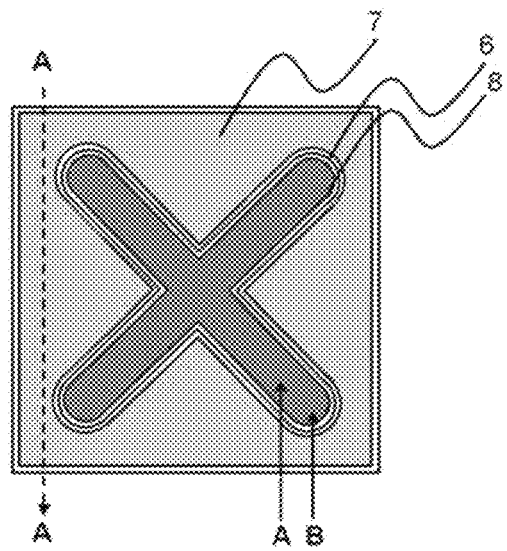
FIG. 8 shows an upper surface structure of a light-emitting element in Comparative Example 2 (without a pad electrode layer).
Figure 9:
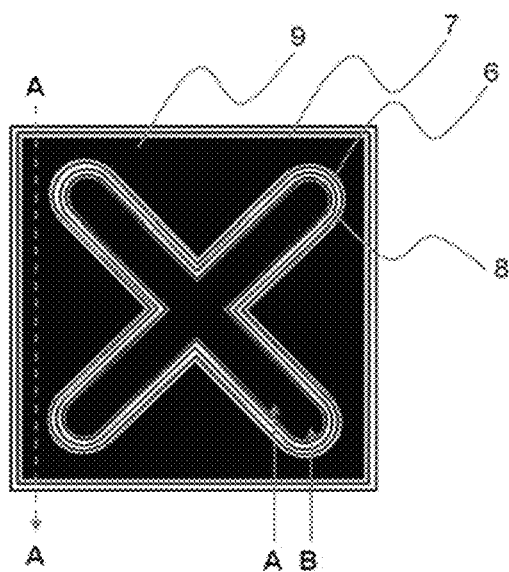
FIG. 9 shows an upper surface structure of a light-emitting element in Comparative Example 2 (with a pad electrode layer).
Figure 10:
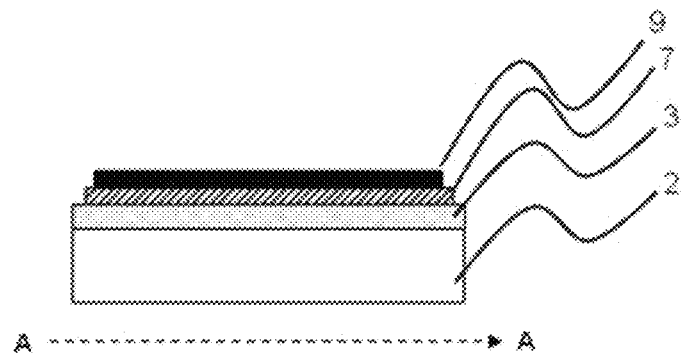
FIG. 10 shows a cross-sectional structure of the light-emitting element in Comparative Example 2.
Figure 11:
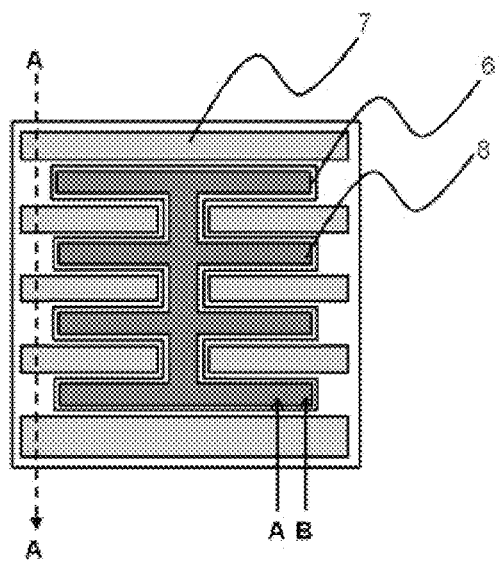
FIG. 11 shows an upper surface structure of a light-emitting element in Example 1 (without a pad electrode layer).
Figure 12:
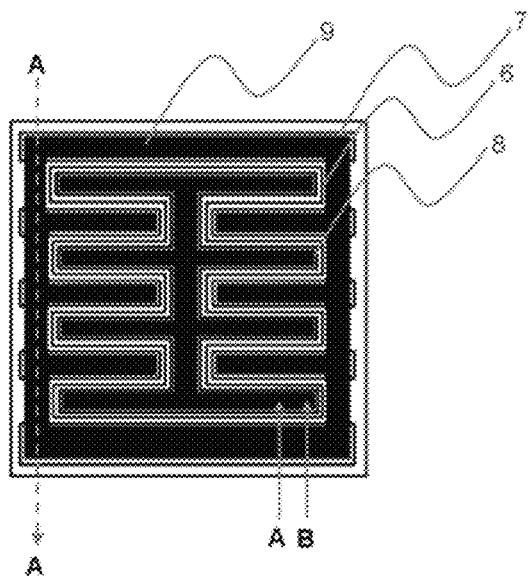
FIG. 12 shows an upper surface structure of a light-emitting element in Example 1 (with a pad electrode layer).
Figure 13:
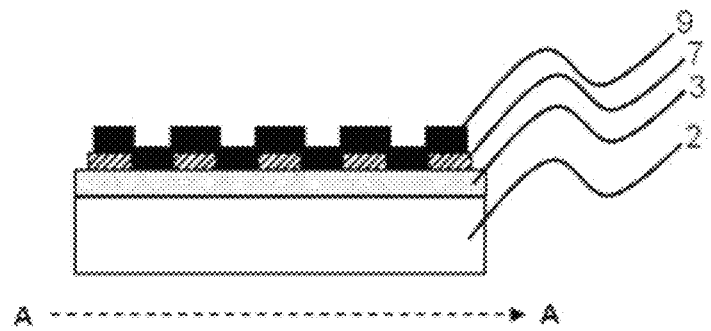
FIG. 13 shows a cross-sectional structure of the light-emitting element in Example 1.
Figure 14:
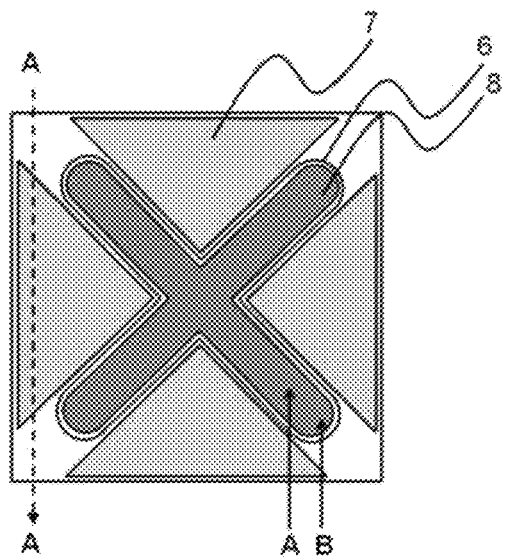
FIG. 14 shows an upper surface structure of a light-emitting element in Example 2 (without a pad electrode layer).
Figure 15:
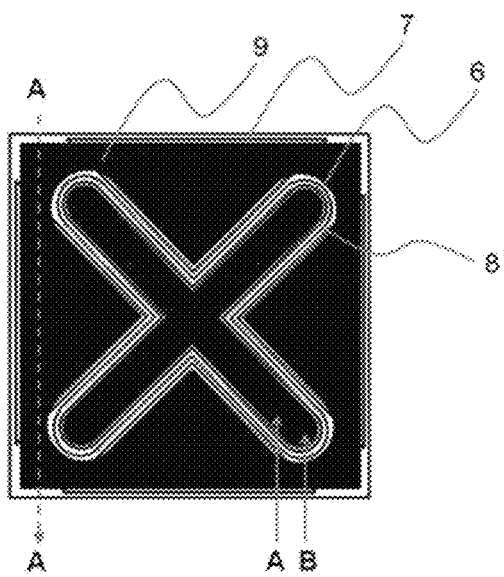
FIG. 15 shows an upper surface structure of a light-emitting element in Example 2 (with a pad electrode layer).
Figure 16:
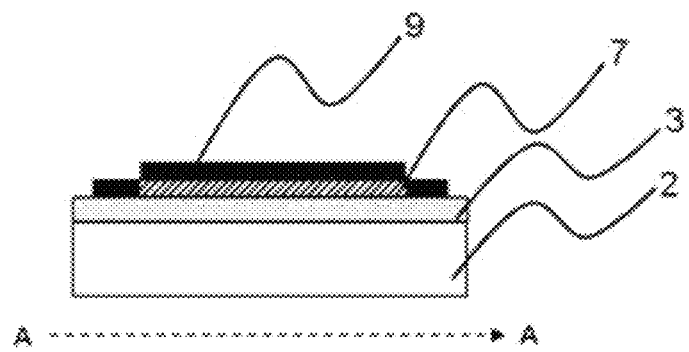
FIG. 16 shows a cross-sectional structure of the light-emitting element in Example 2.
Figure 17:
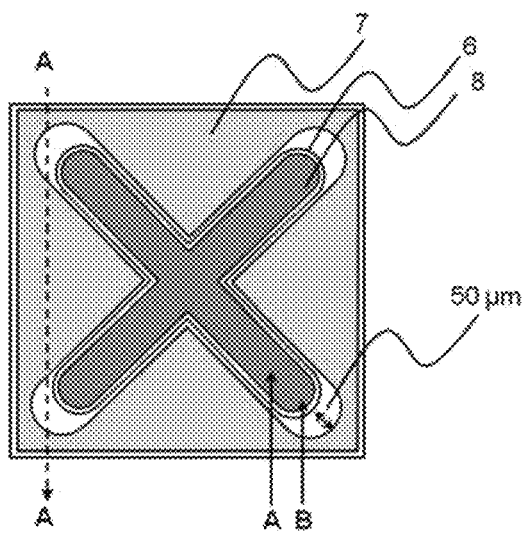
FIG. 17 shows an upper surface structure of a light-emitting element in Example 3 (without a pad electrode layer).
Figure 18:
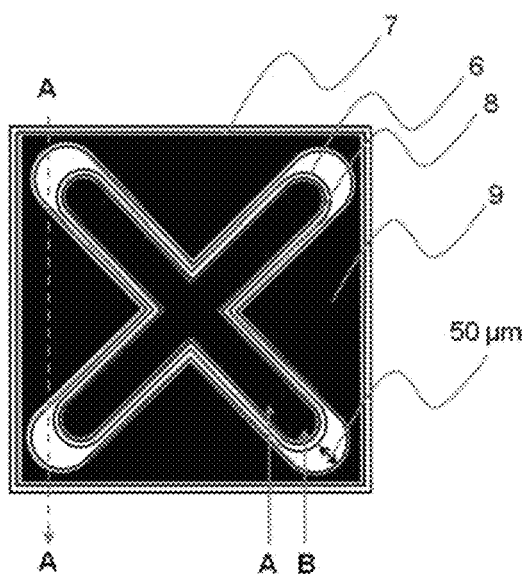
FIG. 18 shows an upper surface structure of a light-emitting element in Example 3 (with a pad electrode layer).
Figure 19:
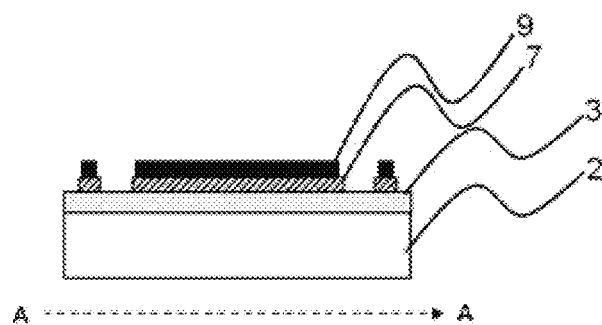
FIG. 19 shows a cross-sectional structure of the light-emitting element in Example 3.

Next, the obtained semiconductor wafer was subjected to a heat treatment in $N_2$ at 900° C. for 20 minutes. After that, a predetermined metal mask pattern was formed on the surface of the p-contact layer by photolithography and vacuum deposition, and then, the surface of the p-contact layer on which no pattern was formed was subjected to dry etching until the n-type layer was exposed to form a mesa structure. Next, a resist pattern was formed by photolithography so as to cover the p-contact layer (Comparative Example 1, Comparative Example 2) or so as to cover the p-contact layer and the n-electrode non-formation region (Example 1, Example 2), further so as to cover the p-contact layer and cover the n-type layer by 50 μm (Example 3: n-electrode is formed 50 μm away from the mesa end). Then, a Ti (20 nm)/Al (200 nm)/Au (5 nm) layer was formed by vacuum deposition. After that, the n-electrode was formed by a heat treatment at 810° C. for 1 minute in $N_2$. Similarly, a Ni (20 nm)/Au (50 nm) layer was formed on the p-type layer, and fired in $O_2$ at 550° C. for 3 minutes to form the p-electrode. After that, a pad electrode layer 9 (Ti (20 nm)/Ni (400 nm)/Au (300 nm)) was formed on the n-electrode and the p-electrode (in Examples 1 and 2, the pad electrode layer was formed not only on the electrodes but also on the n-electrode non-formation region). The obtained semiconductor wafer was cut into 750 m square to obtain a nitride semiconductor light-emitting element (nitride semiconductor light-emitting element having an emission peak wavelength of 265 nm). FIGS. 5 and 8 show upper surface structures of the light-emitting elements before the pad electrode layer is formed in Comparative Example 1 and Comparative Example 2, FIGS. 6 and 9 show the upper surface structures after the pad electrode layer was formed, and FIGS. 7 and 10 show cross-sectional structures in AA cross-sections of FIGS. 6 and 9. FIGS. 11 and 14 show upper surface structures of the light-emitting elements before the pad electrode layer is formed in Example 1 and Example 2, FIGS. 12 and 15 show the upper surface structures after the pad electrode layer was formed, and FIGS. 13 and 16 show cross-sectional structures in AA cross-sections of FIGS. 12 and 15. FIG. 17 shows an upper surface structure of the light-emitting element in Example 3 before the pad electrode layer is formed. FIGS. 18 and 19 show the upper surface structure and the cross-sectional structure thereof after the pad electrode layer was formed.

In Comparative Examples 1 and 2 and Examples 1, 2, and 3, the luminous intensity of the point A of the mesa end flat portion and the point B of the mesa end protruding portion were evaluated, and the light emission unevenness of the light-emitting element was evaluated by taking the luminous intensity ratio of the point B to the point A. Table 1 shows the average value of the results obtained by performing this evaluation for 50 light-emitting elements manufactured for each of the light-emitting elements. The results show that the larger the luminescence intensity ratio, the more the current concentration is. Thus, it has been revealed that the current concentration can be remarkably reduced by the application of the present invention.

Next, for 50 elements manufactured for each of the light-emitting elements in Comparative Examples 1 and 2 and Examples 1, 2, and 3, the temporal change of the output characteristic at the elapsed time of 500 hours was evaluated in terms of the failure rate. The results are shown in Table 1. The measurement was performed at an environmental temperature of 25° C. and an applied current of 150 mA. Incidentally, the failure rate means a rate of the element in which deterioration of the p-electrode of the mesa end protruding portion (leak path is formed by reaction between the electrode and the semiconductor layer proceeding through the active layer) occurs due to current concentration with respect to all the elements. From the results in Table 1, it can be seen that the current concentration in the mesa end protruding portion was alleviated because the light emission unevenness was suppressed by providing the n-electrode non-formation region or by separating the distance between the mesa end and the n-electrode end by 50 μm. It is considered that this reduced the load on the protruding portion, and the failure rate was greatly improved. Note that the emission peak wavelength of the light-emitting elements manufactured in Comparative Examples and Examples was 265 nm.

TABLE 1

|  | comparative example 1 | example 1 | comparative example 2 | example 2 | example 3 |
| --- | --- | --- | --- | --- | --- |
| ratio of emission intensity (point B/point A) | 1.37 | 1.06 | 1.41 | 1.08 | 1.12 |
| failure rate(%) | 20 | 2 | 24 | 4 | 6 |

INDUSTRIAL APPLICABILITY

In the present invention, when the group III nitride semiconductor light-emitting element is viewed from above, an n-electrode non-formation region in which an n-electrode is not formed is provided in the vicinity of the projecting end portion of the mesa end protruding portion, thereby suppressing the current flowing between the p-electrode and the n-electrode from concentrating in the region near the mesa end. As a result, the group III nitride semiconductor light-emitting element is obtained in which local deterioration in the mesa structure is less likely to occur, and light emission unevenness is less likely to occur due to the fact that current easily flows uniformly into the active layer.

REFERENCE SIGNS LIST

1: group III nitride semiconductor light-emitting element
2: substrate
3: n-type layer
4: active layer
5: p-type layer
6: mesa structure
7: n-electrode
8: p-electrode 9: pad electrode layer
A: mesa end flat portion
B: mesa end protruding portion

The invention claimed is:

1. A group Ill nitride semiconductor light-emitting element comprising:
   a substrate;
   a semiconductor structure formed on the substrate, the semiconductor structure having an n-type layer, an active layer and a p-type layer stacked in this order, the active layer and the p-type layer having a surface area smaller than a surface area of the n-type layer when viewed in a plan view so that a part of the n-type layer is exposed through the active and p-type layers, wherein the active and p-type layers form a mesa structure;
   a p-electrode formed on the p-type layer; and
   an n-electrode formed on an exposed surface of the n-type layer,
   wherein the mesa structure includes projection parts, each surrounded by the n-type layer in the plan view, and the n-electrode is disposed more than 50 μm away from each one of the projection parts, and
   wherein a diffusion length of electrons in the n-type layer is less than 50 μm.

2. The group Ill nitride semiconductor light-emitting element according to claim 1, wherein the n-electrode has a plurality of electrode parts which are electrically connected to each other.

3. The group Ill nitride semiconductor light-emitting element according to claim 1, wherein a peak emission wavelength is 200 to 350 nm.

* * * * *